US011508899B2

(12) United States Patent
Hodgins

(10) Patent No.: US 11,508,899 B2
(45) Date of Patent: Nov. 22, 2022

(54) FOIL TRANSDUCER AND VALVE

(71) Applicant: Buerkert Werke GmbH & Co. KG, Ingelfingen (DE)

(72) Inventor: Micah Hodgins, Ingelfingen (DE)

(73) Assignee: Buerkert Werke GmbH & Co. KG, Ingelfingen (DE)

( * ) Notice: Subject to any disclaimer, the term of this patent is extended or adjusted under 35 U.S.C. 154(b) by 1121 days.

(21) Appl. No.: 16/116,031

(22) Filed: Aug. 29, 2018

(65) Prior Publication Data
US 2019/0074423 A1 Mar. 7, 2019

(30) Foreign Application Priority Data
Sep. 1, 2017 (DE) .......................... 102017120131.9

(51) Int. Cl.
| F16K 31/02 | (2006.01) |
| H01L 41/053 | (2006.01) |
| F16K 7/14 | (2006.01) |
| F16K 11/02 | (2006.01) |
| H01L 41/09 | (2006.01) |
| H01L 41/293 | (2013.01) |
| H04R 19/00 | (2006.01) |

(52) U.S. Cl.
CPC ............ *H01L 41/0536* (2013.01); *F16K 7/14* (2013.01); *F16K 11/022* (2013.01); *F16K 31/02* (2013.01); *H01L 41/0986* (2013.01); *H01L 41/293* (2013.01); *H04R 19/00* (2013.01)

(58) Field of Classification Search
CPC ............... H01L 41/0986; H01L 41/293; H01L 41/0536; F16K 31/02
See application file for complete search history.

(56) References Cited

U.S. PATENT DOCUMENTS

| 4,995,550 | A * | 2/1991 | Appl ..................... C25B 11/081 |
| | | | 429/231.5 |
| 9,832,572 | B2 * | 11/2017 | Gerlach ................. H04R 17/005 |
| 10,408,364 | B2 * | 9/2019 | Kraft ...................... F16K 31/122 |
| 10,682,845 | B2 * | 6/2020 | Rodegheri ............ H01L 41/053 |
| 2004/0124738 | A1 | 7/2004 | Pelrine et al. |
| 2016/0091099 | A1 | 3/2016 | Scheibe et al. |

FOREIGN PATENT DOCUMENTS

| DE | 102012215548 A1 | 3/2014 |
| DE | 102012217032 A1 | 4/2014 |
| DE | 102014114212 A1 | 3/2016 |
| WO | 2005089168 A2 | 9/2005 |
| WO | 2017037230 A1 | 3/2017 |

* cited by examiner

*Primary Examiner* — Pho M Luu
(74) *Attorney, Agent, or Firm* — Dilworth IP, LLC

(57) ABSTRACT

A foil transducer for a valve, including at least one firmly arranged holding part, at least one displaceable force transmission part, an electroactive foil composite structure and at least two electrodes. The electroactive foil composite structure has an actuating direction in which the electroactive foil composite structure is extended on actuation. The actuating direction lies in a plane spanned by the electroactive foil composite structure.

17 Claims, 4 Drawing Sheets

FOIL TRANSDUCER AND VALVE

TECHNICAL FIELD

Embodiments of the present disclosure generally relate to a foil transducer for a valve and to a valve with a strip actuator.

BACKGROUND

From the prior art, valves are known that comprise actuators for adjusting a valve element, which include an electroactive polymer (EAP) that converts an electric energy into a mechanical movement. Such actuators also are referred to as EAP actuators.

For example, such a valve is known from DE 10 2014 114 212 A1 in which the actuator is configured as a stack actuator. Such actuators in particular are suitable for relatively large valves, as the stack actuator has a corresponding volume due to its required depth.

There are also known valves that include an EAP actuator configured as foil transducer, via which electric energy correspondingly is converted into mechanical work. In a foil transducer, the difference to a stack actuator consists in that the actuator mostly consists of merely one foil of an electroactive polymer material, so that in a first operating condition (mostly the starting condition) it has a small volume. For example, such a foil transducer is known from DE 10 2016 114 531 A1, in which an actuation of the electroactive foil composite structure leads to a movement out of the plane spanned by the electroactive foil composite structure. In so far, the EAP actuator configured as a foil transducer likewise requires a relatively large volume during operation, i.e. on transition between the active and the inactive operating condition.

Accordingly, in the known valves with EAP actuator one valve each with a high installation space requirement is required in order to be able to convert the electric energy into the mechanical movement.

SUMMARY OF THE INVENTION

It is the object to provide an energy-efficient actuator for a narrow valve and a correspondingly energy-efficient valve.

The object is solved by a foil transducer for a valve, comprising at least one firmly arranged holding part, at least one displaceable force transmission part, an electroactive foil composite structure and at least two electrodes, wherein the electroactive foil composite structure has an actuating direction in which the electroactive foil composite structure is extended on actuation, and wherein the actuating direction lies in a plane spanned by the electroactive foil composite structure.

The idea underlying the present disclosure is to configure the foil transducer, which serves as an actuator for a valve, such that the actuating direction lies in the plane spanned by the electroactive foil composite structure, whereby a narrow actuator is created that in all operating conditions remains of corresponding narrow design. This is due to the fact that there is a so-called "in-plane" direction of movement of the foil transducer, which is perpendicular to the "out-of-plane" actuators usually known from the prior art, which in operation require a correspondingly larger volume, such as a stack actuator. The electroactive foil composite structure for example spatially extends in a plane that in a cartesian coordinate system is spanned in the x-direction and in the y-direction, wherein the depth of the electroactive foil composite structure is negligible in the z-direction, as the electroactive foil composite structure can be formed by a foil of an electroactive polymer. In case a voltage is applied to the electroactive foil composite structure, the electroactive foil composite structure is extended in the defined plane, for example in the y-direction, whereby a valve element coupled to the foil transducer correspondingly is adjusted in the actuating direction in which the foil transducer has expanded, i.e. in the y-direction. On actuation, the foil transducer, in particular the electroactive foil composite structure, hence moves in the plane that is spanned by itself, whereby the volume of the foil transducer changes only slightly. In contrast to the foil transducer according to the present disclosure with the "in-plane" actuating direction, the volume of the foil transducer taken up by the foil transducer would greatly vary on actuation with an "out-of-plane" actuating direction, for example the volume of a cuboid enclosing the foil transducer.

For example, the electroactive foil composite structure consists of a foil of an electroactive polymer.

The foil transducer generally can be used as a strip actuator of a valve.

One aspect provides that the foil transducer has a main direction of extension that coincides with the actuating direction. In so far, the foil transducer can have a substantially rectangular shape, wherein it extends more in one direction than in another direction, whereby the main direction of extension is defined. In this main direction of extension the electroactive foil composite structure correspondingly is extended on actuation. The main direction of extension hence corresponds to that direction of the foil transducer which substantially has the longest dimension, in particular wherein the main direction of extension passes through centers at opposite edges or ends of the foil transducer. Hence, this is not a diagonal in the correspondingly spanned plane.

Another aspect provides that the electrodes are arranged on opposite sides of the electroactive foil composite structure, in particular wherein the electrodes extend across the entire surface of the respective side. In case a voltage is applied to the foil transducer, in particular to the electroactive foil composite structure, which voltage is applied between the two electrodes, a corresponding force of attraction is obtained between the two electrodes due to the generated electric field, whereby the electrodes try to reduce the distance to each other. The electroactive polymer material present between the electrodes thereupon is compressed, whereby the electroactive foil composite structure is extended due to the incompressibility of the material in the correspondingly spanned plane (for example in the x- and y-direction), which is perpendicular to the thickness (z-direction) of the foil transducer that corresponds to the distance of the two electrodes to each other.

The opposite sides of the electroactive foil composite structure, on which the electrodes are arranged, can be referred to as upper side and as underside or as upper surface and as undersurface. The electrodes hence are arranged on opposite surfaces of the electroactive foil composite structure.

According to one embodiment, a first end of the electroactive foil composite structure is held, in particular clamped at the holding part, and/or a second end of the electroactive foil composite structure opposite to the first end is coupled to the force transmission part, in particular clamped. In so far, the holding part and the force transmission part each can comprise a clamping point at which the electroactive foil composite structure is mechanically clamped. The electroactive foil composite structure accordingly extends from the holding part, in particular from the clamping point provided there, up to the clamping point of the force transmission part.

Furthermore, electrical contacts for electrically contacting the electrodes can be provided on the holding part and/or on the force transmission part. For example, both on the holding part and on the force transmission part an electrical contact each is provided, with which the first electrode and the second electrode are electrically contacted. Alternatively, both electrodes of the foil transducer can be electrically contacted on the holding part and on the force transmission part, respectively.

According to another aspect, the force transmission part includes an actuating portion that extends along the actuating direction over at least the entire length of the electroactive foil composite structure, in particular wherein the actuating portion includes an opening region through which the electroactive foil composite structure and/or the holding part extend or extends. The force transmission part in particular includes an actuating portion when a valve element of the valve including the foil transducer is arranged on a side opposite to the clamping point of the force transmission part with respect to the electroactive foil composite structure. Correspondingly, the adjusting movement of the force transmission part, which is initiated at the clamping point of the force transmission part, is transmitted to the valve element via the actuating portion.

As the actuating portion extends at least over the entire length of the electroactive foil composite structure, a corresponding opening region can be provided in the force transmission part, in particular in the actuating portion, in the case of a symmetric configuration of the force transmission part, so that the electroactive foil composite structure is disposed within this opening region of the actuating portion. The corresponding holding part likewise can extend through the opening region, in case the actuating portion is longer than the entire length of the electroactive foil composite structure.

In particular, the force transmission part substantially is of T-shaped design. The clamping point is arranged at the crossbar of the T, whereas the actuating portion is formed by the web extending perpendicularly to the crossbar.

In general, the force transmission part also can be of multipart design, for example of two-part design.

Another aspect provides that at least one spring cooperates with the force transmission part in order to mechanically pretension the electroactive foil composite structure, in particular two springs that engage opposite sides of the force transmission part with respect to the electroactive foil composite structure. The mechanical pretension of the electroactive foil composite structure is necessary to ensure the function of the foil transducer, in particular the function of the electroactive foil composite structure. In case two springs are provided, which engage opposite sides, a homogeneous pretension of the electroactive foil composite structure is ensured.

The foil transducer can include an actuator housing that at least encloses the electroactive foil composite structure, wherein the holding part is firmly connected to the actuator housing or wherein the actuator housing includes the holding part. The electroactive foil composite structure correspondingly is mounted in a protected way so that the same is not damaged. The holding part can be formed integrally with the actuator housing or as a separate part that is connected to the actuator housing, for example by means of an adhesive, non-positive or positive connection.

Another embodiment provides that a rocker, in particular an end of the rocker, is associated with the force transmission part. Via the rocker, a plurality of switching positions can be provided for the valve with the corresponding foil transducer.

Another aspect provides that the electroactive foil composite structure comprises a flexible frame that encloses the electroactive polymer material. In so far, the electroactive foil composite structure is mechanically protected, in particular its EAP material. Due to the flexibility of the frame it is ensured that the electroactive foil composite structure can be adjusted or move in the desired way.

Furthermore, embodiments of the present disclosure generally relate to a valve with a strip actuator that is configured as a foil transducer as mentioned above, in particular wherein the valve comprises a valve element configured as a flexible membrane, which the strip actuator adjusts on actuation. The valve element configured as a flexible membrane among other things serves for media separation, so that the valve includes a fluid portion and an actuator portion that comprises the strip actuator. The fluid ports of the valve are arranged in the fluid portion of the valve, which correspondingly is sealed with respect to the strip actuator via the flexible membrane.

In other words, the strip actuator is associated with a sealed space of the actuator housing. In particular, the interior space of the actuator housing is sealed completely.

BRIEF DESCRIPTION OF THE DRAWINGS

Further advantages and properties of the present disclosure can be taken from the following description and the drawings to which reference is made. In the drawings.

DETAILED DESCRIPTION OF THE INVENTION

Figure 1:
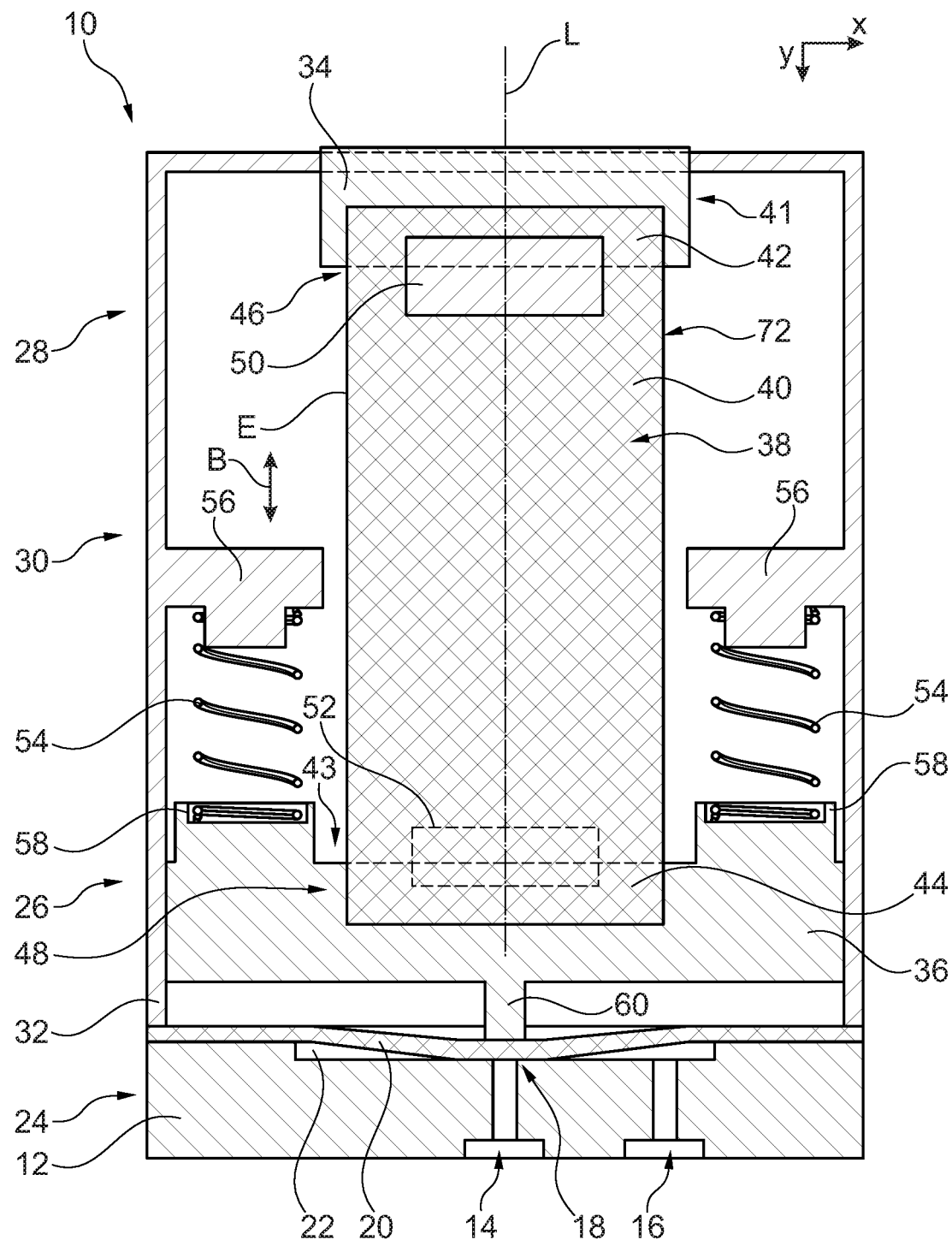
FIG. 1 shows a sectional representation of a valve according to the present disclosure in the closed, actuated position with a foil transducer according to a first embodiment of the present disclosure.

FIG. 1 shows a valve 10 that is configured as a normally open valve (NO valve). In the representation, the valve 10 however is in the closed position, because it is actuated correspondingly, as will yet be explained below.

The valve 10 comprises a fluid housing 12 with a first fluid port 14 and a second fluid port 16, wherein in the illustrated embodiment a valve seat 18 is associated with the first fluid port 14, via which the valve 10 can be opened or closed correspondingly.

For this purpose, the valve seat 18 cooperates with a valve element 20 that in the illustrated embodiment is formed by a flexible membrane.

The valve element 20 or the flexible membrane furthermore is associated with a collecting space 22 that is provided between the valve element 20 and the valve seat 18 when the valve element 20 is in its non-actuated or open position. In the collecting space 22 a fluid can accumulate, which can flow off correspondingly via the fluid port 14 when the valve element 20 is in its corresponding position, i.e. the open position in which the valve element 20 does not rest on the valve seat 18.

Alternatively, the valve element 20 can close or clear the inlet into the collecting space 22 depending on its position, in that the valve element 20 is pressed or not pressed onto the valve seat 18.

In so far, the first fluid port 14 can serve as an inlet or outlet. The second fluid port 16 likewise can act as an outlet or inlet.

The valve element 20 configured as a flexible membrane furthermore serves for media separation, as it separates and seals a fluid portion 24 of the valve 10 from an actuator portion 26 that comprises a foil transducer 30 configured as a strip actuator 28.

The foil transducer 30 includes an actuator housing 32, wherein the valve element 20 is arranged between the actuator housing 32 and the fluid housing 12, in particular is clamped at least at the edge.

Furthermore, the foil transducer 30 comprises a stationarily arranged holding part 34 coupled to the actuator housing 32 and an displaceable or movably arranged force transmission part 36 that cooperates with the valve element 20 in order to correspondingly adjust the same, so as to transfer it for example from the open position into the closed position.

For actuating the valve element 20, the foil transducer 30 includes an electroactive foil composite structure 38 that in the illustrated embodiment is formed by a foil 40 of an electroactive polymer, so that the foil 40 can also be referred to as an electroactive polymer foil.

The electroactive foil composite structure 38 is mechanically held with a first end 41 at a first clamping point 42 of the holding part 34 and with a second end 43 opposite to the first end 41 at a second clamping point 44 of the force transmission part 36, in particular clamped at the corresponding clamping points 42, 44.

At the clamping points 42, 44 electrical contacts 46, 48 each are provided, which are electrically connected with corresponding electrodes 50, 52 of the foil transducer 30 in order to apply electric energy to the foil transducer 30.

In the illustrated embodiment, the electrodes 50, 52 are arranged on opposite sides of the electroactive foil composite structure 38, i.e. of the corresponding foil 40, as can be taken from the second electrode 52 illustrated in broken lines.

For reasons of clarity, the two electrodes 50, 52 here are shown only in part, wherein they can extend over the entire surface of the respective side of the electroactive foil composite structure 38, so that the electroactive polymer material of the electroactive foil composite structure 38 is arranged between the two electrodes 50, 52.

The two electrodes 50, 52 accordingly are arranged in the z-direction, i.e. the direction perpendicular to the illustrated drawing plane. The z-direction corresponds to the thickness of the foil transducer 30, in particular of the electroactive foil composite structure 38, which generally is to be neglected.

Furthermore, two springs 54 are provided in the illustrated embodiment, which with one end each are supported on a bearing portion 56 of the actuator housing 32. With their other end the springs 54 engage engagement points 58 of the force transmission part 36, so that the electroactive foil composite structure 38 is pretensioned via the springs 54 in that the electroactive foil composite structure 38 is pre-stretched in the y-direction.

In the illustrated embodiment, the two springs 54 are arranged on opposite sides of the force transmission part 36 with respect to the electroactive foil composite structure 38, so that they substantially exert a homogeneous force on the electroactive foil composite structure 38 in order to mechanically pretension the same. Tilting of the electroactive foil composite structure 38 due to the spring force thus is effectively prevented.

The springs 54 urge the force transmission part 36 towards the closed position, which is shown in FIG. 1, so that an actuating protrusion 60 of the force transmission part 36, which in the illustrated embodiment is configured as a web, rests against the valve element 20. The spring force of the springs 54 however is not so high that the valve element 20 would be pressed into the closed position.

The springs 54 can also be formed by shaped springs, disk springs, rubber bands, rubber bodies or other pretensioning elements, which ensure a pretension of the foil transducer 30, in particular of the electroactive foil composite structure 38. The other pretensioning elements for example are magnetic pretensioning elements that provide a magnetic pretension of the foil transducer 30, or pretensioning elements that consist of a combination of spring elements and magnetic elements and thus provide a spring-magnetic pretension of the foil transducer 30. The magnetic pretensioning elements in particular are configured as permanent-magnetic pretensioning elements.

In the following, it will be explained how the foil transducer 30 is brought from its open starting position into the closed position shown in FIG. 1.

For this purpose, an electric voltage is applied to the two electrical contacts 46, 48, whereby the electrodes (electrode layers) 50, 52 of the electroactive foil composite structure 38 attract each other, so that the interposed electroactive polymer material is compressed.

As the electroactive polymer material is incompressible, the reduction of the thickness (in the z-direction) leads to an increase in length of the electroactive foil composite structure 38 in the plane E spanned by the foil composite structure 38, which is defined by the x-direction and the y-direction, which corresponds to the drawing plane.

In particular, the electroactive foil composite structure 38 is extended in the y-direction, which correspondingly is the actuating direction B of the electroactive foil composite structure 38 or of the foil transducer 30. In so far, this results in a movement of the foil transducer 30, in particular of the electroactive foil composite structure 38, in the plane E spanned by the foil transducer 30, which is referred to as an "in-plane" movement.

The actuating direction B coincides with the main direction of extension L of the substantially rectangular and thin (as seen in the z-direction) electroactive foil composite structure 38, as can be taken from FIG. 1 in which the main direction of extension L corresponds to the center line of the electroactive foil composite structure 38 along its largest dimension.

Due to the applied voltage, the electroactive foil composite structure 38 thus is extended in the plane E spanned by the foil transducer 30 in the direction of the valve element 20. The actuating protrusion 60 of the force transmission part 36 thereby transfers the valve element 20 into its closed position shown in FIG. 1, in which the valve element 20 is pressed onto the valve seat 18 in order to close the first fluid port 14 with respect to the collecting space 22.

On actuation of the foil transducer 30, i.e. on transfer from the open position into the closed position, the force transmission part 36 is adjusted against the spring force of the springs 54 in order to close the valve 10.

Figure 2:
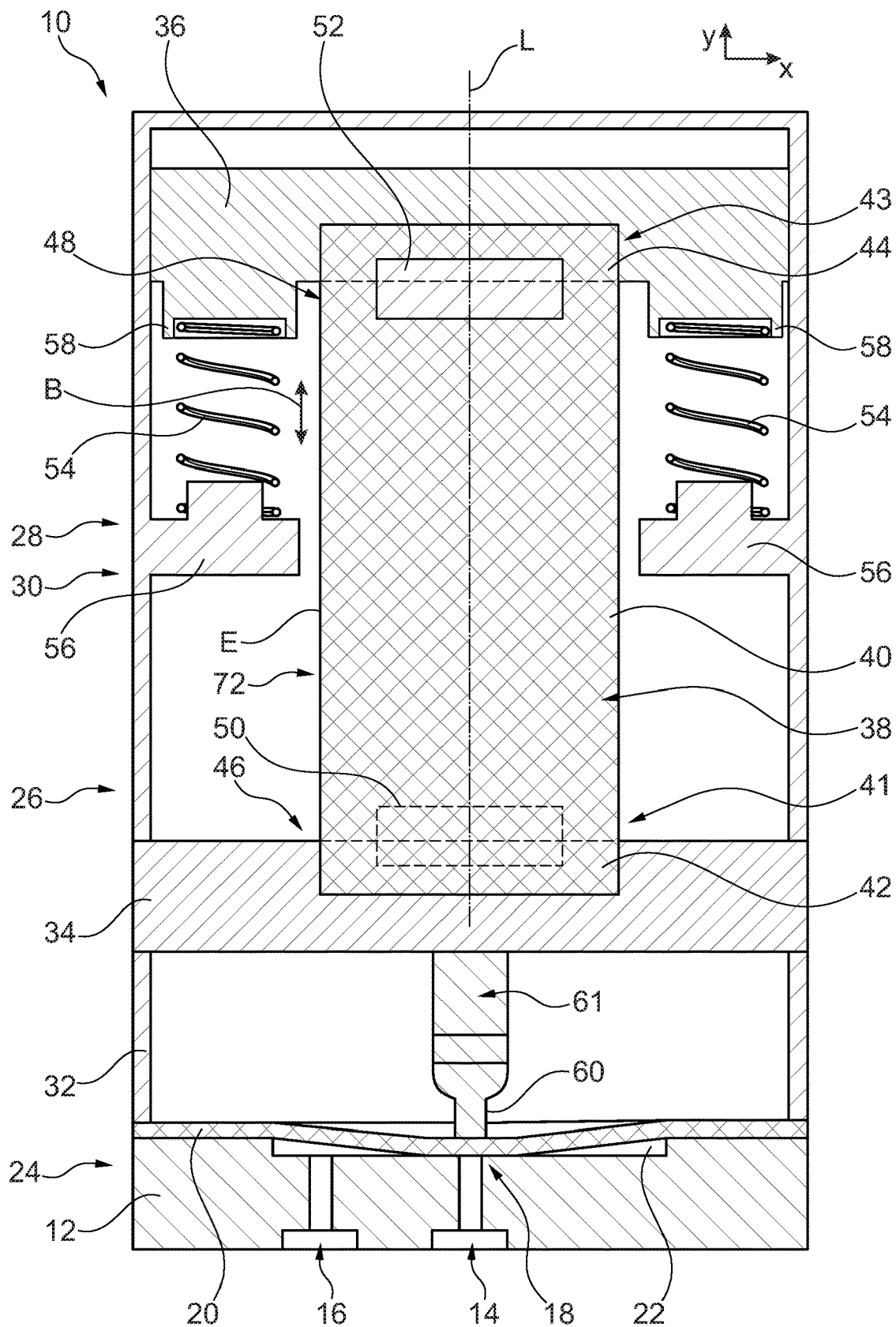
FIG. 2 shows a sectional representation of a valve according to the present disclosure in the closed, non-actuated position with a foil transducer according to a second embodiment of the present disclosure.
Figure 3:
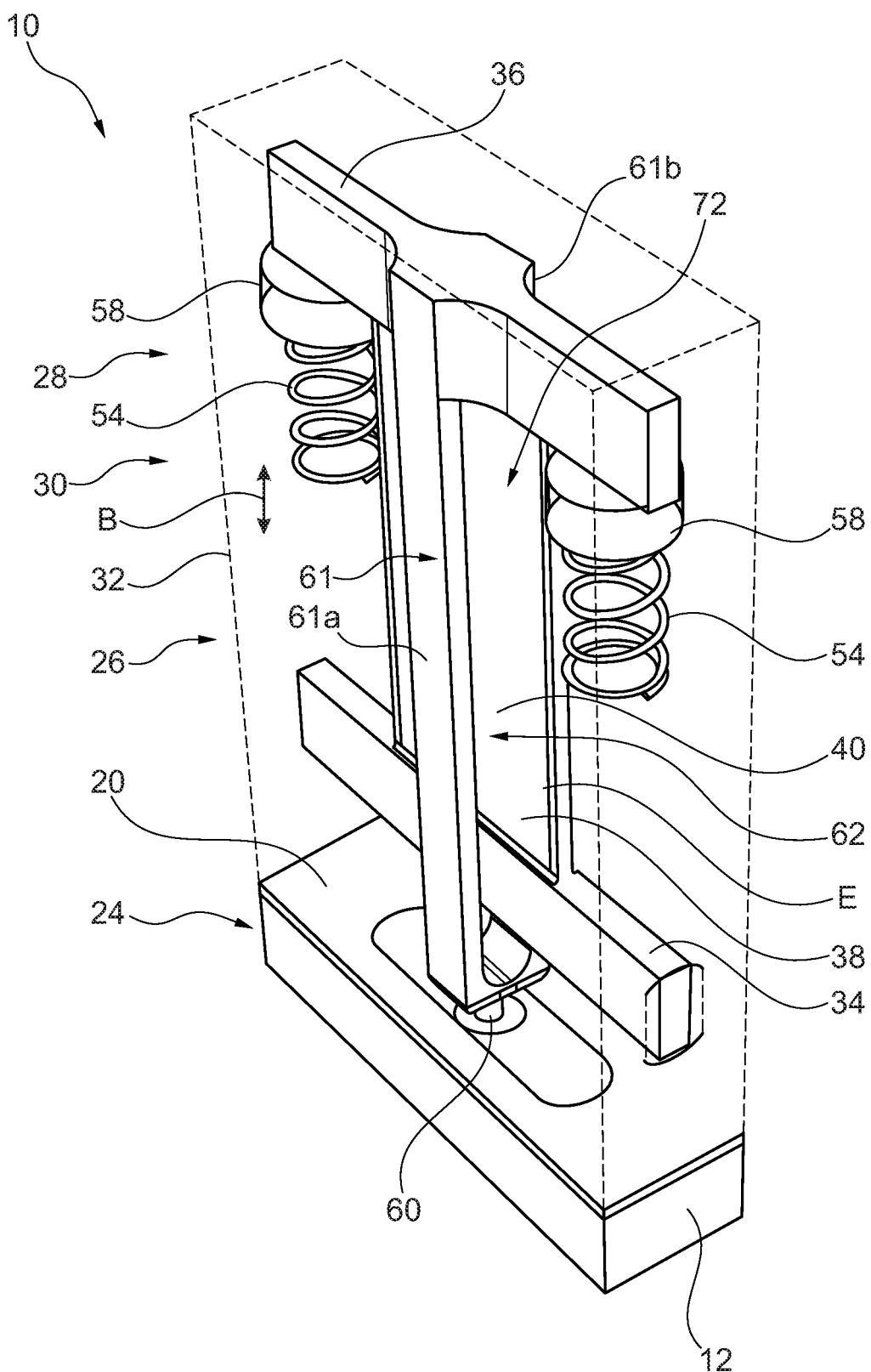
FIG. 3 shows a perspective representation of the valve of FIG. 2 with the actuator housing shown transparent.

FIGS. 2 and 3 show a second embodiment of a valve 10 according to the present disclosure, which comprises a second embodiment of a strip actuator 28 or foil transducer 30.

In the following, the differences to the first embodiment will be described in detail.

The valve 10 according to the second embodiment is a normally closed valve (NC valve) in which the valve element 20 closes the valve seat 18 when no voltage is applied to the foil transducer 30, i.e. in the non-actuated condition, as shown in FIGS. 2 and 3.

The second embodiment furthermore differs from the first embodiment to the effect that the firmly arranged holding part 34 is arranged at the end of the electroactive foil composite structure 38 facing the valve element 20, whereas the force transmission part 36 is provided at the end of the electroactive foil composite structure 38 facing away from the valve element 20.

In so far, the holding part 34 and the force transmission part 36 have been switched with respect to the electroactive foil composite structure 38 as compared to the first embodiment.

In the first embodiment, the force transmission part 36 has served as a lifting armature of the NO valve, whereas in the second embodiment the force transmission part 36 serves as a lifting armature of the NC valve.

To transmit the movement of the force transmission part 36 to the valve element 20, the force transmission part 36 therefore comprises an actuating portion 61, as can be taken in particular from FIG. 3.

The actuating portion 61 extends along the actuating direction B over at least the entire length of the electroactive foil composite structure 38 (in the y-direction). In addition, the actuating portion 61 includes an opening region 62 in which both the electroactive foil composite structure 38 and the holding part 34 are at least partly arranged, as can be taken from FIGS. 2 and 3. In so far, the actuating portion 61 comprises two webs 61a, 61b extending in the actuating direction B or in the y-direction, between which the opening region 62 is provided.

The force transmission part 36 is of substantially T-shaped design, wherein the clamping point 44 of the force transmission part 36 is arranged at the crossbar of the T-shaped force transmission part 36 and the actuating portion 60 forms the web perpendicular to the crossbar.

Like in the first embodiment, the force transmission part 36 includes the engagement points 58 for the springs 54, wherein the springs 54 likewise are supported on the bearing portions 56 of the actuator housing 32 in order to mechanically pretension the electroactive foil composite structure 38, i.e. to stretch the same in the actuating direction B.

In case a voltage is applied via the electrical contacts 46, 48 that are arranged in the holding part 34 and in the force transmission part 36, in particular in the region of the clamping points 42, 44, the electroactive foil composite structure 38 is extended in the actuating direction B, as has been described already for the first embodiment. The force transmission part 36 thereby likewise is axially adjusted in the actuating direction B against the spring force of the springs 54, namely upwards in the orientation shown in FIGS. 2 and 3.

A tensile force thereby can be exerted via the force transmission part 36, in particular the actuating portion 61, whereby the part of the force transmission part 36 resting against the valve element 20, i.e. the actuating protrusion 60, moves away from the valve element 20, so that the valve element 20 is actively transferred into the open position. This is the case in particular when the valve element 20 is coupled to the actuating protrusion 60.

Alternatively, the actuating protrusion 60 can merely be brought out of contact with the valve element 20, so that the same automatically moves into the open position due to its pretension and/or the applied fluid pressure.

In case the voltage at the foil transducer 30 is decreased, the electroactive foil composite structure 38 returns to its original length (as seen in the y-direction or the actuating direction B), which is shown in FIG. 2. As a result, the actuating protrusion 60 of the force transmission part 36 again presses the valve element 20 onto the valve seat 18 in order to transfer the valve 10 into its original (non-actuated) closed position.

Figure 4:
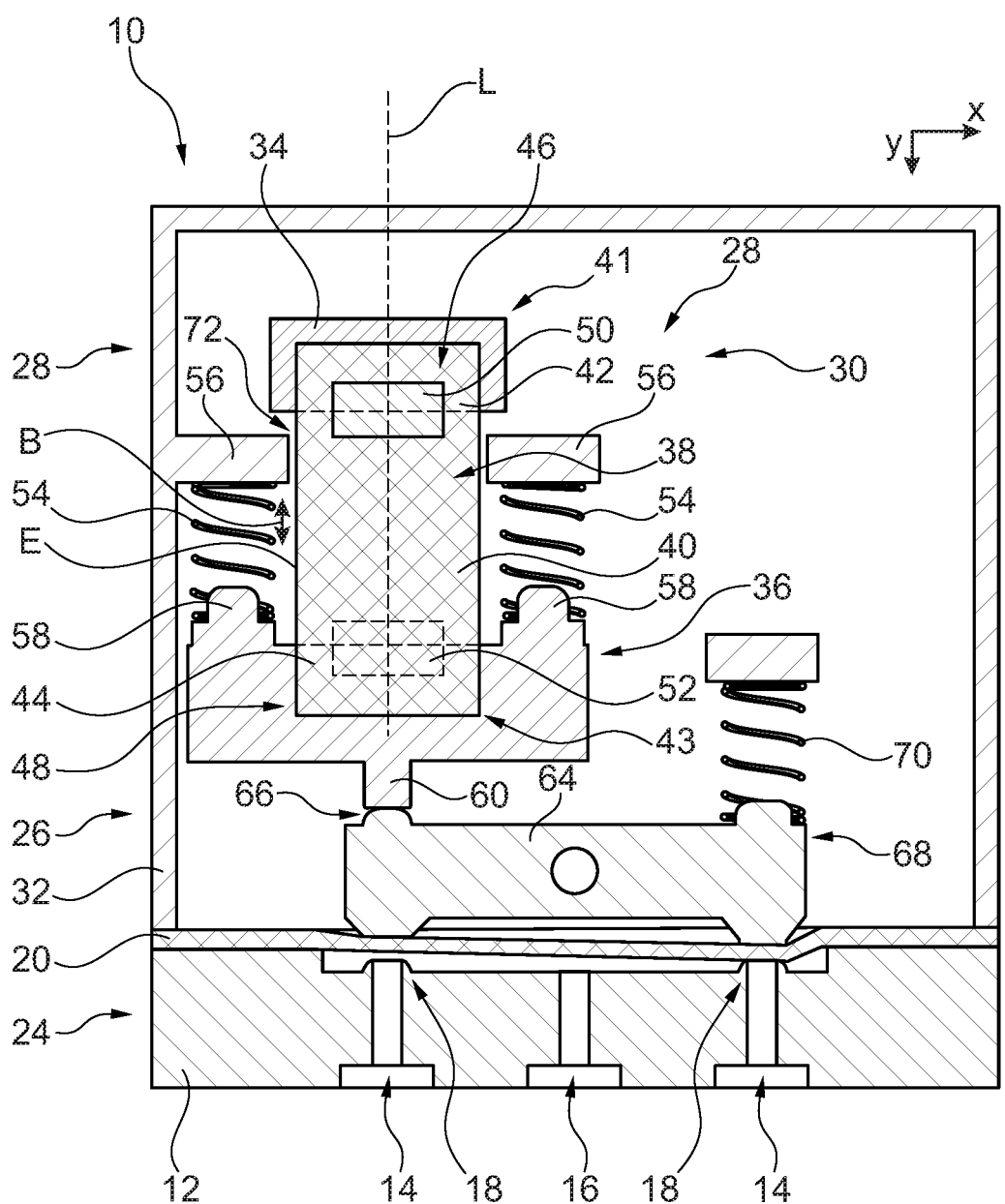
FIG. 4 shows a sectional representation of a valve according to the present disclosure in the open, non-actuated position with a foil transducer according to a third embodiment of the present disclosure.

FIG. 4 shows a third embodiment of the valve 10, which differs from the first embodiment shown in FIG. 1 to the effect that the force transmission part 36 is associated with a rocker 64, in particular with an end 66 of the rocker 64 that cooperates with the valve element 20. Accordingly, the force transmission part 36 does not directly cooperate with the valve element 20 via its actuating protrusion 60, but indirectly via the rocker 64.

The other end 68 of the rocker 64 is pretensioned via a compression spring 70, so that the valve 10 assumes a defined position in the non-actuated condition of the strip actuator 28 or of the foil transducer 30. This starting position is shown in FIG. 4.

In the illustrated embodiment the fluid housing 12 comprises three fluid ports, two of which are first fluid ports 14 that have a corresponding valve seat 18 with which the rocker 64 is associated, in particular the ends 66, 68 of the rocker 64. In general, the fluid housing 12 in a way analogous to the embodiments according to FIGS. 1 to 3 can however also comprise only one first fluid port 14 and one second fluid port 16.

The actuation of the foil transducer 30 substantially is effected in a way analogous to the embodiment described in FIG. 1, wherein an actuation of the foil transducer 30 results in a change of the rocker position of the rocker 64 from the starting position shown in FIG. 4.

When a voltage is applied, the actuating protrusion 60 of the force transmission part 36 presses onto the associated end 66 of the rocker 64 due to the "in-plane" actuation in the y-direction along the actuating direction B, so that the rocker 64 correspondingly is pivoted. The end 66 of the rocker 64 then presses onto the valve element 20, so that the valve element 20 seals the associated valve seat 18. At the same time, the other valve seat 18 that is associated with the other end 68 of the rocker 64 is released due to the pivoting movement of the rocker 64.

In so far, it can be adjusted via the foil transducer 30 which one of the first fluid ports 14 having a valve seat 18 is released in order to get into flow connection with the second fluid port 16.

Optionally, in all embodiments it can be provided that the electroactive foil composite structure 38 comprises a flexible frame 72 that encloses the electroactive polymer material, so that the same is protected correspondingly.

All embodiments are characterized by the fact that the strip actuator 28 or the foil transducer 30 expands in the actuating direction B, in case an electric voltage is applied to the electroactive foil composite structure 38. This means that the electroactive foil composite structure 38 expands in the direction in which the force transmission part 36 also is adjusted. As the actuating direction B lies in the plane that is spanned by the electroactive foil composite structure 38, it is possible that a narrow valve 10 can be created, as the moving parts required for the adjusting movement of the valve 10 move in one direction, namely the actuating direction B.

In addition, all embodiments reveal that the fluid ports 14, 16 each can be arranged on one side of the fluid housing 12, whereby a narrow valve 10 is obtained, which can also be used under difficult mounting conditions.

In general, the electrical contacts 46, 48 can both be arranged in the holding part 34 or both in the force transmission part 36. In particular, the arrangement of the two electrical contacts 46, 48 in the stationary holding part 34 simplifies the construction of the strip actuator or the foil transducer 30 and thus of the valve 10.

The construction of the strip actuator 28 or of the foil transducer 30, i.e. the "in-plane" actuating direction B, provides for the actuator housing 32 to have a depth-width ratio (extension in the z-direction to the extension in the x-direction) between 1:15 and 1:2, in particular between 1:7 and 1:3.

Accordingly, the valve 10 substantially has the same depth-width ratio as the actuator housing 32.

In general, the electroactive foil composite structure 38 can also be formed by a multilayer foil composite structure that correspondingly comprises a plurality of foils of an electroactive polymer material. The individual foils are separated from each other by electrodes 50, 52 whose polarity each alternates, so that each foil of the stack is delimited by two different electrodes 50, 52, in particular over its entire surface.

The respective electrodes 50, 52 accordingly rest against opposite sides of each foil, as likewise is the case with the electroactive foil composite structure 38 with only one foil according to the illustrated embodiments.

The plurality of foils of the electroactive foil composite structure 38 formed as a stack can each be through-plated on a corresponding front side of the foil composite structure 38, so that all electrodes 50, 52 with the same polarity are contacted by only one associated contact 46, 48 that has the corresponding polarity.

What is claimed is:

1. A foil transducer for a valve, serving as an actuator for the valve and comprising at least one firmly arranged holding part, at least one displaceable force transmission part, an electroactive foil composite structure and at least two electrodes, the electroactive foil composite structure having an actuating direction in which the electroactive foil composite structure is extended on actuation, and the actuating direction lying in a plane spanned by the electroactive foil composite structure; wherein a first end of the electroactive foil composite structure is held at the holding part, and a second end of the electroactive foil composite structure opposite to the first end is coupled to the force transmission part.

2. The foil transducer according to claim 1, wherein the foil transducer has a main direction of extension that coincides with the actuating direction.

3. The foil transducer according to claim 1, wherein the electrodes are arranged on opposite sides of the electroactive foil composite structure.

4. The foil transducer according to claim 3, wherein the electrodes extend over an entire surface of the respective side.

5. The foil transducer according to claim 1, wherein at least one of the first end and the second end is clamped.

6. The foil transducer according to claim 1, wherein, on at least one of the holding part and the force transmission part, electrical contacts are provided for electrically contacting the electrodes.

7. The foil transducer according to claim 1, wherein the force transmission part is formed substantially T-shaped.

8. The foil transducer according to claim 1, wherein at least one spring cooperates with the force transmission part in order to mechanically pretension the electroactive foil composite structure.

9. The foil transducer according to claim 8, wherein two springs are provided that engage opposite sides of the force transmission part with respect to the electroactive foil composite structure.

10. The foil transducer according to claim 1, wherein the foil transducer includes an actuator housing that encloses at least the electroactive foil composite structure, the holding part being firmly connected to the actuator housing or the actuator housing including the holding part.

11. The foil transducer according to claim 1, wherein a rocker is associated with the force transmission part.

12. The transducer according to claim 11, wherein an end of the rocker is associated with the force transmission part.

13. The foil transducer according to claim 1, wherein the electroactive foil composite structure comprises a flexible frame that encloses an electroactive polymer material.

14. A foil transducer for a valve, serving as an actuator for the valve and comprising at least one firmly arranged holding part, at least one displaceable force transmission part, an electroactive foil composite structure and at least two electrodes, the electroactive foil composite structure having an actuating direction in which the electroactive foil composite structure is extended on actuation, and the actuating direction lying in a plane spanned by the electroactive foil composite structure, wherein the force transmission part includes an actuating portion that extends along the actuating direction over at least an entire length of the electroactive foil composite structure.

15. The foil transducer according to claim 14, wherein the actuating portion includes an opening region through which at least one of the electroactive foil composite structure and the holding part extends.

16. A valve with a strip actuator, wherein the strip actuator is configured as a foil transducer comprising at least one firmly arranged holding part, at least one displaceable force transmission part, an electroactive foil composite structure and at least two electrodes, the electroactive foil composite structure having an actuating direction in which the electroactive foil composite structure is extended on actuation, and the actuating direction lying in a plane spanned by the electroactive foil composite structure and coinciding with an actuation direction of the displaceable force transmission part.

17. The valve according to claim 16, wherein the valve comprises a valve element formed as a flexible membrane, which the strip actuator adjusts on actuation.

* * * * *